United States Patent [19]

Sherman et al.

[11] Patent Number: 5,097,121
[45] Date of Patent: Mar. 17, 1992

[54] BEVELED EDGE IMPURITY BAND CONDUCTION DETECTOR

[75] Inventors: Michael G. Sherman, Corona; Craig S. Tindall, Irvine, both of Calif.

[73] Assignee: Rockwell International Corp., El Segundo, Calif.

[21] Appl. No.: 645,428

[22] Filed: Jan. 24, 1991

[51] Int. Cl.$^5$ ............................................. H01J 40/14
[52] U.S. Cl. .................................. 250/211 J; 357/30
[58] Field of Search ................ 250/211 R, 211 J, 226, 250/227.31, 338.4; 357/30 L, 30 D, 30 R, 58

[56] References Cited

U.S. PATENT DOCUMENTS

| | | | |
|---|---|---|---|
| 3,487,223 | 12/1969 | St. John | 357/30 L |
| 4,079,507 | 3/1978 | King | 37/30 D |
| 4,494,132 | 1/1985 | Kohn | 357/30 D |
| 4,568,960 | 2/1986 | Petroff et al. | 357/30 |
| 4,586,068 | 4/1986 | Petroff et al. | 357/30 |
| 4,896,202 | 1/1990 | Bharat et al. | 357/30 |
| 4,962,304 | 10/1990 | Stapelbroek et al. | 250/211 |

FOREIGN PATENT DOCUMENTS 0039020 11/1981 European Pat. Off. .......... 357/30 L

Primary Examiner—David C. Nelms
Assistant Examiner—S. Allen
Attorney, Agent, or Firm—John C. McFarren

[57] ABSTRACT

An impurity band conduction (IBC) detector having a substrate and a thin layer IR active region is provided with a beveled edge for increasing the quantum efficiency of the detector. The edge of the transparent detector substrate is beveled at an angle equal to or greater than the critical angle for total internal reflection of radiation in the material of the substrate and active region of the detector. The radiation is directed into the detector normal or nearly normal to the beveled edge. The radiation travels the length of the detector due to total internal reflection within the detector. As a result, the radiation passes through the IR active region of the detector a plurality of times, thereby increasing the probability that a photon will be absorbed by an impurity within the IR active region and sensed by the detector. The efficiency of the IBC detector is further increased because the beveled edge provides a greatly increased surface area for focusing and aligning the incident radiation directed into the detector, thereby improving the efficiency of coupling the radiation to the detector.

6 Claims, 1 Drawing Sheet

BEVELED EDGE IMPURITY BAND CONDUCTION DETECTOR

TECHNICAL FIELD

The present invention relates to impurity band conduction (IBC) detectors and, in particular, to an IBC detector having a beveled edge for channeling input radiation through the infrared (IR) active region of the detector a plurality of times.

BACKGROUND OF THE INVENTION

Infrared detectors have use in a wide variety of scientific, medical, industrial astronomical, and military applications. In recent years, the field of IR photoreceptors has been advanced with the development of impurity band conduction (IBC) devices. Various implementations of these devices are described in "Blocked Impurity Band (BIB) Detectors," U.S. Pat. No. 4,568,960 issued to Petroff et al.; "Solid State Photomultiplier," U.S. Pat. No. 4,586,068 issued to Petroff et al.; "Short Wavelength Impurity Band Conduction Detectors," U.S. Pat. No. 4,896,202 issued to Bharat et al; and "Intrinsic Impurity Band Conduction Detectors," U.S. Pat. No. 4,962,302 issued to Stapelbroek et al. The teachings of these prior patents are incorporated herein by reference.

The quantum efficiency of back-illuminated arsenic-doped silicon IBC detectors in the near IR region (wavelengths of about 1 to 2 $\mu$m) is approximately 3% under optimal operating conditions. This low efficiency results from the small cross-section of the arsenic impurities in the active region of the detector at these wavelengths. A known approach for improving the quantum efficiency in the near IR region has been to illuminate the IBC detector on its edge. In edge-illuminated devices, the input radiation traverses a greater distance in the IR active region of the detector, thus providing greater opportunity for photon absorption by impurities in the active region, and thereby improving efficiency. In actual practice, however, the efficiency of edge-illuminated devices is less than the theoretically achievable because of the difficulty in focusing and aligning all the incoming radiation into the thin IR active region. Similar difficulties are encountered in coupling optical fibers to the detector because of the small dimensions involved. These difficulties are significant because they decrease the sensitivity of detectors that are required to detect very low levels of IR radiation. Thus, there is a continuing need to increase the quantum efficiency of detectors in the near IR region.

SUMMARY OF THE INVENTION

The present invention is applicable to thin layer detectors, and especially to epitaxially grown impurity band conduction (IBC) detectors. Unlike bulk detectors, IBC detectors have a thin (25-50 micron) IR active layer epitaxially grown atop an inactive substrate. It is an object of the present invention to increase the transmission distance of a near IR photon within the thin IR active region to increase the probability that the photon will be sensed by the detector.

The present invention comprises an IBC detector having a substrate, an IR active region, and a beveled edge. The edge of the detector is beveled at an angle slightly greater then the critical angle for total internal reflection of radiation in the material of the detector. Incoming radiation is directed into the detector normal or nearly normal to the beveled edge. The radiation travels the length of the detector due to total internal reflection within the substrate and IR active region. As a result, the radiation passes through the IR active region of the detector a plurality of times, thereby increasing the probability that a photon will be absorbed by an impurity within the IR active region and sensed by the detector.

The efficiency of the IBC detector of the present invention is further increased by the beveled edge because focusing and aligning the incident radiation is simplified compared to an edge-illuminated IBC detector. The beveled edge provides a greatly increased surface area through which the radiation can enter the detector. Therefore, aligning and focusing the lenses or coupling the optical fibers to the detector is much easier using a beveled edge, and optimum performance of the detector is thus more easily achieved.

BRIEF DESCRIPTION OF THE DRAWINGS

For a more complete understanding of the present invention and for further advantages thereof, the following Detailed Description of the Preferred Embodiment makes reference to the accompanying Drawings in which.

DETAILED DESCRIPTION OF THE PREFERRED EMBODIMENT

Figure 1:
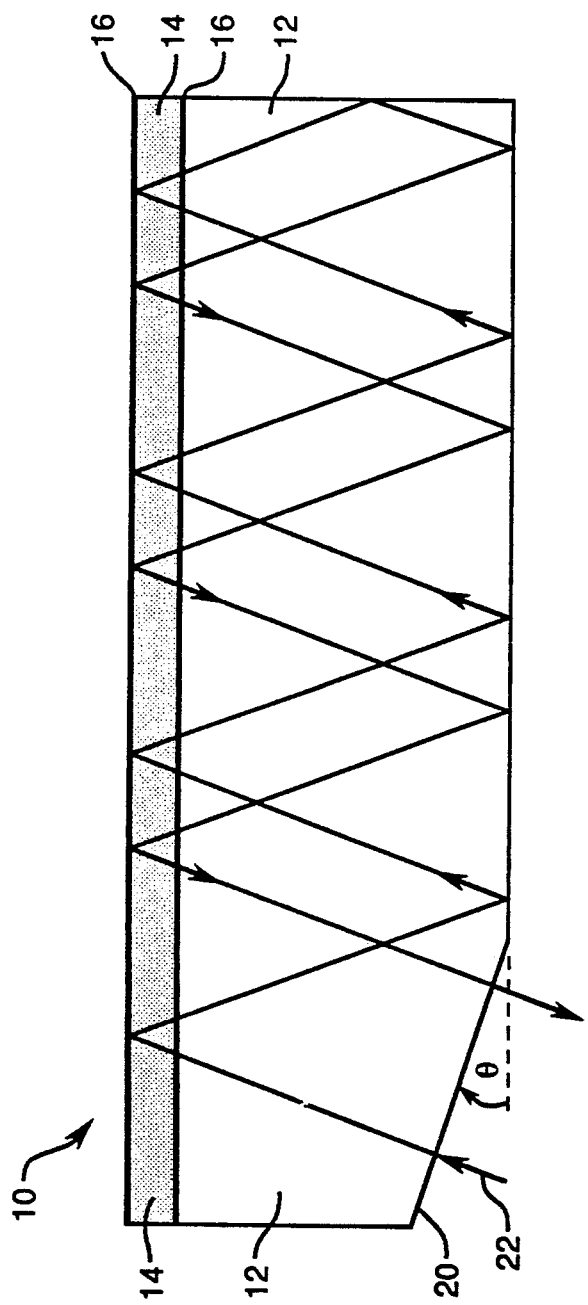
FIG. 1 is a schematic cross-section of an IBC detector of the present invention showing total internal reflection of incident radiation entering the detector through a beveled edge.

FIG. 1 is a schematic, cross-sectional representation of an IBC detector 10 of the present invention. Detector 10 comprises a substrate 12, a thin layer IR active region 14, and electrical contacts 16 for providing an electric field across active region 14 of detector 10. Substrate 12 may comprise undoped silicon, for example, and active region 14 may comprise a thin layer of photosensitive material, such as an epitaxial layer of silicon containing impurities of arsenic or gallium, for example, plus an undoped blocking layer grown atop substrate 12. Therefore, depending on the specific type of IBC detector, active region 14 may comprise additional layers, such as an impurity band layer, a gain region, or a blocking layer, for example, each containing a different impurity concentration.

Detector 10 includes a bevel 20 on one edge of detector 10. Typically, the surface of bevel 20 is polished and/or coated with an anti-reflection film to enhance its light transmission characteristics. In FIG. 1, bevel 20 is illustrated as extending only through substrate 12, but it may also extend through active region 14 in alternative embodiments of the invention. Bevel 20 is formed for the purpose of receiving radiation, indicated by arrow 22, directed into detector 10 by a lens system or an optical fiber (neither shown) coupled to bevel 20. For best efficiency, radiation 22 is generally directed into detector 10 normal or nearly normal to the surface of bevel 20. Therefore, bevel 20 is formed at an angle $\theta$ with respect to the bottom surface of substrate 12 such that $\theta$ is at least as great as the critical angle for total internal reflection of radiation 22 in the material of detector 10. Angle $\theta$ may also be adjusted depending on the f/# pertaining to the incident light to optimize quantum efficiency of the detector. As illustrated in FIG. 1, radiation 22 is directed into detector 10 through bevel 20 and is totally reflected within the material of substrate 12 and active region 14 until it is absorbed in layer 14 or exits the detector.

In the preferred embodiment of detector 10, substrate 12 comprises undoped silicon. Silicon is the preferred material for substrate 12 because it has a high index of refraction and a high transparency to near IR radiation. Although internally reflected radiation 22 spends most of its time in substrate 12 rather than active region 14, the high transparency of silicon substrate 12 minimizes losses within substrate 12 and permits most of the absorption of radiation 22 to occur within IR active region 14. Furthermore, the critical angle for internal reflection in silicon is approximately 17°, which is desirable because radiation can be directed into detector 10 at an angle (i.e., $\theta \approx 17°$) that provides a relatively large number of internal reflections within a small detector area.

Detector 10 provides a great improvement in quantum efficiency of an IBC detector because radiation 22 is reflected through active region 14 a plurality of times, thereby increasing the probability that a photon will be absorbed by an impurity in active region 14 and thus detected by detector 10. In general, the number of passes of radiation 22 through IR active region 14 is directly proportional to the length of detector 10 and inversely proportional to its thickness. Therefore, constructing a longer and thinner detector 10 with a thicker IR active region 14 would increase the quantum efficiency of detector 10.

Experiments have been performed on a prototype detector 10 using radiation in the wavelength band of 1.0 to 1.3 μm without optimizing the optics or the design of the detector. In a first configuration, one optical fiber was positioned to direct radiation into detector 10 through bevel 20, and another optical fiber was positioned to direct the same radiation through the backside of detector 10, which is a standard mode of operation in the prior art. In a second configuration, a lens was used to direct the radiation into detector 10, and the detector was moved relative to the radiation so that the photoresponse of the detector could be compared for the radiation entering the beveled edge versus radiation entering the backside of detector 10. In both test configurations, the sensitivity of detector 10 was a factor of 6 to 7 greater for radiation entering the beveled edge as compared to radiation entering the backside. This large improvement in efficiency of detector 10 is believed to be a lower limit of enhancement because none of the design parameters of detector 10 were optimized prior to the tests.

Although the present invention has been described with respect to a specific embodiment thereof, various changes and modifications may be suggested to one skilled in the art. Therefore, it is intended that the present invention encompass such changes and modifications as fall within the scope of the appended claims.

We claim:
1. An impurity band conduction detector, comprising:
   a substrate having a high transparency to infrared radiation;
   an impurity doped thin layer IR active region disposed atop said substrate;
   electrical contacts connected above and below said IR active region for providing an electric field across said IR active region; and
   a beveled edge for receiving radiation entering the detector, said beveled edge forming an angle with respect to the bottom of said substrate at least as great as a critical angle for total internal reflection so that said radiation entering the detector is reflected internally to pass through said IR active region a plurality of times.
2. The detector of claim 1, wherein said substrate comprises silicon and said beveled edge is at an angle of at least 17° with respect to the bottom surface of said substrate.
3. The detector of claim 2, wherein said IR active region comprises arsenic doped silicon and said beveled edge is formed in said substrate.
4. An impurity band condition detector having high quantum efficiency in detecting near IR radiation, comprising:
   a silicon substrate having high transparency to infrared radiation in a wavelength band of approximately 1 to 2 μm;
   an impurity doped thin layer IR active region disposed atop said substrate, said active region sensitive to infrared radiation;
   a first electrical contact connected above said IR active region and a second electrical contact connected below said IR active region, said electrical contacts providing an electric potential across said IR active region;
   said substrate and IR active region having a critical angle for total internal reflection of infrared radiation entering the detector;
   a beveled edge for receiving said infrared radiation entering the detector, said beveled edge forming an angle with respect to the bottom of said substrate at least as great as said critical angle.
5. The detector of claim 4, wherein said beveled edge is at an angle of at least 17° with respect to the bottom surface of said substrate so that said radiation is totally reflected inside the detector and passes through said IR active region a plurality of times.
6. The detector of claim 5, wherein:
   said impurity doped IR active region comprises arsenic doped silicon; and
   said beveled edge is formed in said silicon substrate.

* * * * *